US011990359B2

(12) United States Patent
Yamaguchi et al.

(10) Patent No.: US 11,990,359 B2
(45) Date of Patent: May 21, 2024

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: Kokusai Electric Corporation, Tokyo (JP)

(72) Inventors: Takatomo Yamaguchi, Toyama (JP); Hidenari Yoshida, Toyama (JP); Kenji Ono, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 457 days.

(21) Appl. No.: 17/476,151

(22) Filed: Sep. 15, 2021

(65) Prior Publication Data

US 2022/0005717 A1 Jan. 6, 2022

Related U.S. Application Data

(63) Continuation of application No. PCT/JP2019/011456, filed on Mar. 19, 2019.

(51) Int. Cl.
*H01L 21/677* (2006.01)
*H01L 21/324* (2006.01)

(52) U.S. Cl.
CPC ...... *H01L 21/67778* (2013.01); *H01L 21/324* (2013.01)

(58) Field of Classification Search
CPC .................. H01L 21/324; H01L 21/67778
(Continued)

(56) References Cited

U.S. PATENT DOCUMENTS 5,943,230 A 8/1999 Rinnen et al.
9,006,116 B2 * 4/2015 Terasaki .............. C23C 16/4488
438/787
(Continued)

FOREIGN PATENT DOCUMENTS

JP 10-12703 A 1/1998
JP 10-326731 12/1998
(Continued)

OTHER PUBLICATIONS

IPOS Office Action for Singapore Application No. 11202110193Y, dated Oct. 4, 2022, 7 pages.
(Continued)

*Primary Examiner* — Monica D Harrison
(74) *Attorney, Agent, or Firm* — Edell, Shapiro & Finnan, LLC

(57) ABSTRACT

According to one aspect of the technique, there is provided a method of manufacturing a semiconductor device, including: (a) heating a substrate retainer in a reaction chamber, wherein the substrate retainer is provided with a plurality of slots capable of accommodating a plurality of substrates in a multistage manner; (b) repeatedly performing a set including: (b-1) moving the substrate retainer so as to locate one or more of the slots outside the reaction chamber; and (b-2) charging one or more of the substrates into the one or more of the slots; and (c) moving the substrate retainer such that the plurality of substrates charged in the plurality of slots are accommodated in the reaction chamber.

19 Claims, 5 Drawing Sheets

(58) Field of Classification Search
USPC .......................................................... 438/795
See application file for complete search history.

(56) References Cited

U.S. PATENT DOCUMENTS

| | | |
|---|---|---|
| 2015/0197851 A1 | 7/2015 | Yoon et al. |
| 2016/0013086 A1 | 1/2016 | Yang et al. |
| 2016/0195331 A1 | 7/2016 | Hyon et al. |
| 2018/0090310 A1 | 3/2018 | Shimamoto et al. |
| 2019/0152722 A1 | 5/2019 | Wakabayashi et al. |

FOREIGN PATENT DOCUMENTS

| | | |
|---|---|---|
| JP | H10335426 A | 12/1998 |
| JP | 2007-027159 A | 2/2007 |
| JP | 2007-311724 A | 11/2007 |
| JP | 2011-060842 A | 3/2011 |
| JP | 2015-526594 A | 9/2015 |
| JP | 2016-516293 A | 6/2016 |
| JP | 2016-174158 A | 9/2016 |
| JP | 2016-540372 A | 12/2016 |
| JP | 2017-194951 A | 10/2017 |
| JP | 2018-014469 A | 1/2018 |
| JP | 2018-056173 A | 4/2018 |
| TW | 202101650 A | 1/2021 |

OTHER PUBLICATIONS

Office Action in corresponding Japanese Patent Application No. 2021-506888, dated Apr. 18, 2022, with English translation.
Office Action in corresponding Taiwan Patent Application No. 110131290, dated Nov. 4, 2021, with English translation.

* cited by examiner

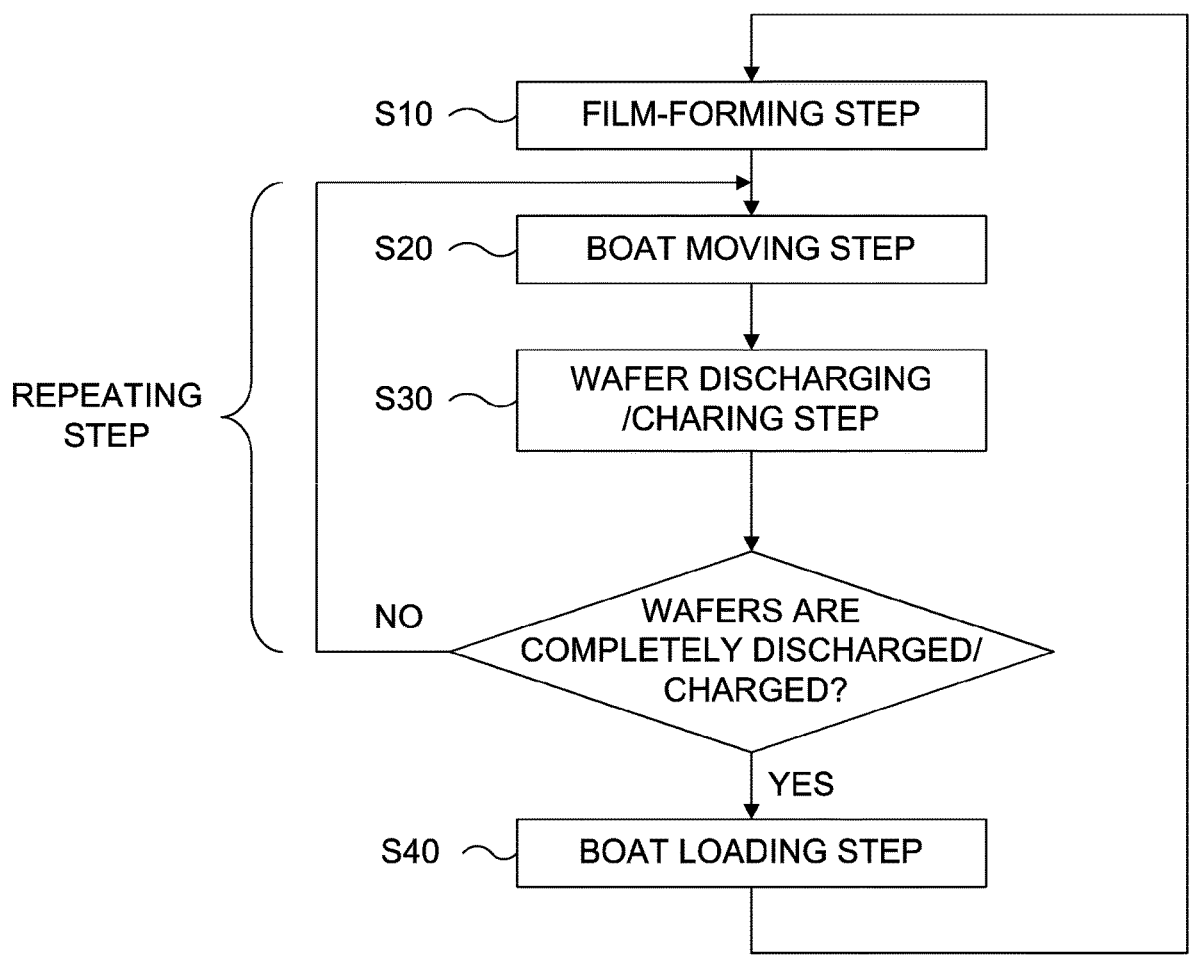

METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS REFERENCE TO RELATED APPLICATIONS

This application is a continuation of International Application No. PCT/JP2019/011456, filed on Mar. 19, 2019, the entire contents of which are hereby incorporated by reference.

TECHNICAL FIELD

The present disclosure relates to a method of manufacturing a semiconductor device, a substrate processing apparatus and a non-transitory computer-readable recording medium.

BACKGROUND

Conventionally, as a part of a manufacturing process of a semiconductor device, a substrate processing may be performed to process a plurality of substrates charged (loaded) in a substrate retainer in a heated process furnace.

SUMMARY

Some embodiments of the present disclosure provide a technique capable of improving a productivity of the substrate processing described above.

According to one or more embodiments of the present disclosure, there is provided a technique that includes: (a) heating a substrate retainer in a reaction chamber, wherein the substrate retainer is provided with a plurality of slots capable of accommodating a plurality of substrates in a multistage manner; (b) repeatedly performing a set including: (b-1) moving the substrate retainer so as to locate one or more of the slots outside the reaction chamber; and (b-2) charging one or more of the substrates into the one or more of the slots; and (c) moving the substrate retainer such that the plurality of substrates charged in the plurality of slots are accommodated in the reaction chamber.

BRIEF DESCRIPTION OF THE DRAWINGS

FIG. 4 is a flow chart schematically illustrating an exemplary flow of a substrate processing according to the embodiments described herein.

DETAILED DESCRIPTION

Embodiments

Hereinafter, one or more embodiments (also simply referred to as "embodiments") according to the technique of the present disclosure will be described. A substrate processing apparatus according to the embodiments will be described with reference to the drawings.

1. Exemplary Configuration of Substrate Processing Apparatus

An exemplary configuration of a substrate processing apparatus 10 according to the present embodiments will be described with reference to FIGS. 1 and 2.

Overall Configuration

Figure 1:
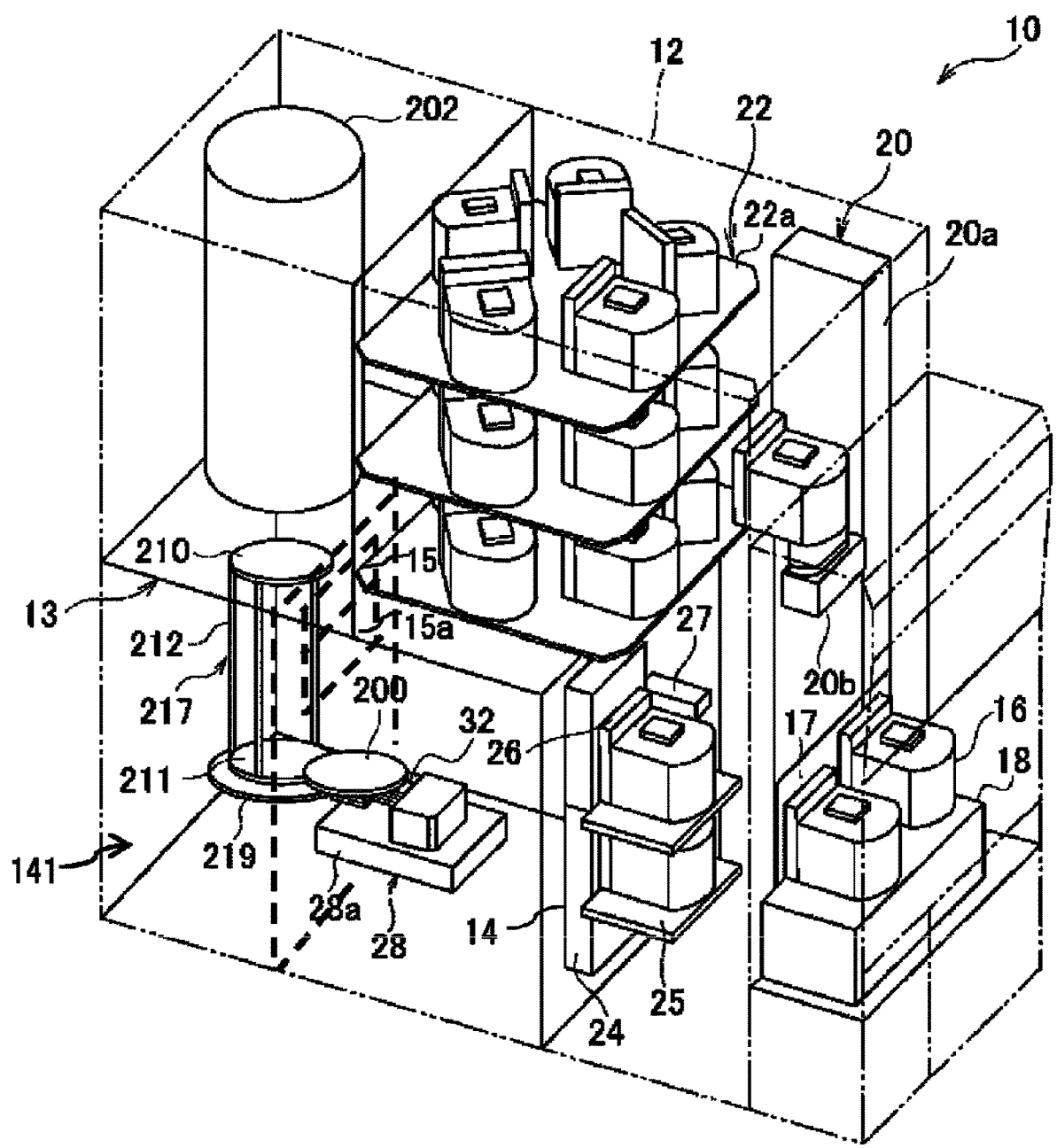
FIG. 1 is a diagram schematically illustrating an oblique perspective view of a substrate processing apparatus according to one or more embodiments described herein.

As shown in FIG. 1, the substrate processing apparatus 10 is configured as a batch vertical type heat treatment apparatus. For example, a process furnace 202 is provided in the substrate processing apparatus 10, and the substrate processing apparatus 10 includes a housing 12 configured as a pressure resistant container. A pod 16 serving as a substrate transfer container is used to transfer a wafer 200 serving as a substrate into and out of the housing 12. The pod 16 is configured to accommodate a plurality of wafers (for example, 200 wafers) including the wafer 200 made of a material such as silicon (Si) and silicon carbide (SiC). Hereinafter, the plurality of wafers including the wafer 200 may also be simply referred to as wafers 200. A pod transfer port (not shown) through which the pod 16 is transferred into and out of the housing 12 is provided at the housing 12 so as to communicate with an inside and an outside of the housing 12. The pod transfer port is opened and closed by a front shutter 17 serving as an opening and closing structure.

A pod stage 18 serving as a pod delivery stage is provided at the housing 12. The pod 16 is placed on the pod stage 18 with a lid closed, and the pod 16 can be aligned while placed on the pod stage 18. The pod 16 is transferred to and placed on the pod stage 18 by an in-process transfer apparatus (not shown) and transferred from the pod stage 18 by the in-process transfer apparatus.

A rotatable pod shelf 22 serving as a pod mounting shelf is provided in an upper space in the housing 12. The rotatable pod shelf 22 is provided in a vertical direction, and includes a vertical column (not shown) capable of rotating intermittently along a horizontal direction and a plurality of shelf plates 22a serving as a pod mounting table. The plurality of shelf plates 22a are configured to be fixed radially in a horizontal orientation at positions of an upper portion, a lower portion and a mid portion of the vertical column. Each of the plurality of shelf plates 22a is configured to support the pod 16 placed thereon.

A pod transfer device 20 is provided between the pod stage 18 and the rotatable pod shelf 22 in the housing 12. The pod transfer device 20 may include: a pod elevator 20a serving as a pod elevating structure and capable of elevating and lowering the pod 16 while holding the pod 16; and a pod transfer structure 20b capable of moving the pod 16 in a horizontal direction while holding the pod 16. The pod transfer device 20 is configured to transfer the pod 16 among the pod stage 18, the rotatable pod shelf 22 and a pod opener 24 described later by cooperative operations of the pod elevator 20a and the pod transfer structure 20b.

Figure 2:
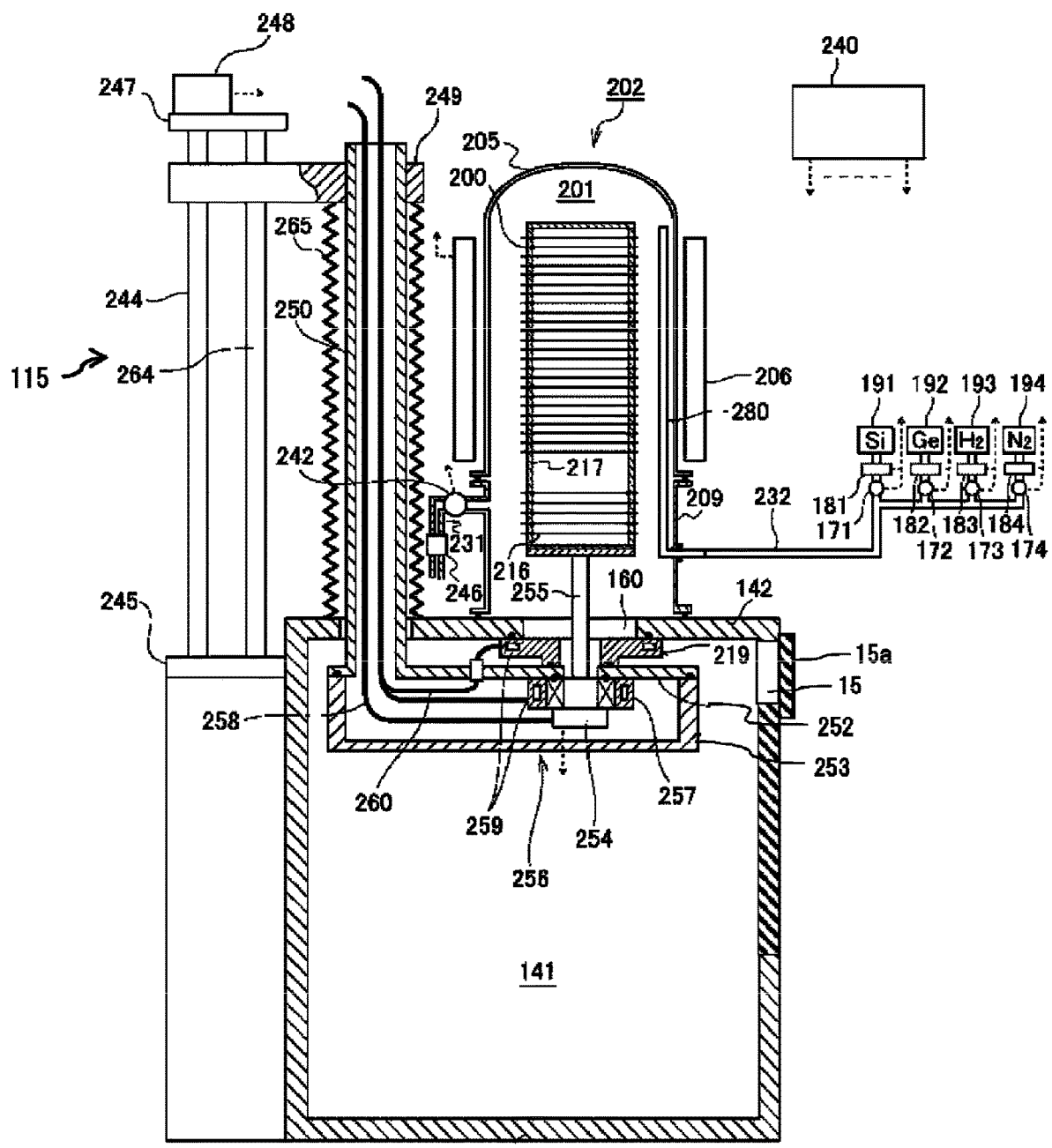
FIG. 2 is a diagram schematically illustrating a vertical cross-section of a process furnace and its surroundings provided in the substrate processing apparatus according to the embodiments described herein.

A loading chamber 141 is provided in a lower space in the housing 12 (see FIGS. 1 and 2). The loading chamber 141 is airtightly isolated from other spaces in the housing 12 provided with components such as the pod transfer device 20 and the rotatable pod shelf 22. In FIG. 1, for convenience, a side wall of the loading chamber 141 is illustrated by a broken line. Above the side wall of the loading chamber 141, an opening 15 through which the wafer 200 is transferred into or out of the loading chamber 141 and a gate 15*a* configured to open or close the opening 15 are provided. A wafer transfer port 14 through which the wafer 200 is transferred into or out of a wafer charging structure 28 described later is provided in an upper stage and a lower stage of a sub-housing 13 constituting the loading chamber 141 (see FIG. 1). The pod opener 24 is provided at the wafer transfer port 14 with respect to the upper and lower stages of the sub-housing 13. The pod opener 24 includes: a mounting table 25 on which the pod 16 is placed; and a cap attaching/detaching structure 26 capable of attaching and detaching a cap which is the lid of the pod 16. The pod opener 24 is configured to open and close a wafer entrance of the pod 16 by attaching or detaching the cap of the pod 16 placed on the mounting table 25 by the cap attaching/detaching structure 26. A wafer number detector 27 is provided in the vicinity of the pod opener 24. The wafer number detector 27 is configured to detect the number of the wafers 200 in the pod 16 whose lid is opened.

Subsequently, an exemplary configuration of the process furnace 202 will be described with reference to FIGS. 1 and 2.

Reaction Tube

As shown in FIG. 2, the process furnace 202 includes a reaction tube 205 serving as a reaction chamber. The reaction tube 205 is made of a non-metallic heat resistant material such as quartz ($SiO_2$) and SiC. The reaction tube 205 is of a cylindrical shape with an open lower end and a closed upper end. A process chamber 201 in which the wafer 200 is processed is provided in a hollow cylindrical portion inside the reaction tube 205. An inner diameter of the reaction tube 205 is configured to be greater than a maximum outer diameter of a boat 217 charged with the wafer 200.

A manifold 209 is provided under the reaction tube 205 to be aligned in a manner concentric with the reaction tube 205. The manifold 209 is made of a metal material such as stainless steel (SUS). The manifold 209 is of a cylindrical shape with open upper and lower ends. An inner diameter of the manifold 209 is configured to be greater than the maximum outer diameter of the boat 217. The upper end of the manifold 209 is engaged with the lower end of the reaction tube 205 so as to support the reaction tube 205. An O-ring (not shown) serving as a seal is provided between the manifold 209 and the reaction tube 205. The loading chamber 141 in which the wafer 200 is transferred (charged) into the boat 217 described later or transferred (discharged) out of the boat 217 is provided under the manifold 209. An O-ring (not shown) serving as a seal is provided between a top plate 142 of the loading chamber 141 and the manifold 209. As the manifold 209 is supported by the top plate 142, the reaction tube 205 is installed vertically. A furnace opening 160 serving as an opening of the process furnace 202 is provided at the top plate 142.

Boat

The boat 217 serving as a substrate retainer is configured to be transferred into or out of the process chamber 201 through a lower end opening of the manifold 209. The boat 217 includes a pair of plates, that is, a top plate 210 and a bottom plate 211, and a plurality of support columns 212 arranged vertically and provided between the top plate 210 and the bottom plate 211 to connect the top plate 210 and the bottom plate 211 (see FIG. 1). For example, the top plate 210, the bottom plate 211 and the plurality of support columns 212 are made of a heat resistant material such as $SiO_2$ and SiC. A plurality of recesses (not shown) serving as substrate supports capable of supporting the wafers 200 in a multistage manner are engraved at each of the support columns 212 at equal intervals in a lengthwise direction of each of the support columns 212. The plurality of recesses located at the same stage of each of the support columns 212 are open to face one another. By inserting an outer peripheral edge of the wafer 200 into the plurality of recesses located at the same stage of each of the support columns 212, the boat 217 supports the wafers 200 vertically arranged in a multistage manner while the wafers 200 are horizontally oriented with their centers aligned with one another. In the present specification, a region provided in the boat 217 and in which the wafer 200 is to be accommodated may also be referred to as a "slot". In the boat 217, a plurality of slots in which the wafers 200 may be accommodated are provided in a multistage manner in the vertical direction.

A plurality of insulating plates including an insulating plate 216 of a disk shape serving as a heat insulator is provided in a horizontal orientation in a multistage manner under the boat 217. For example, the insulating plate 216 is made of a heat resistant material such as $SiO_2$ and SiC. The insulating plate 216 is configured to suppress the transmission of the heat from a heater 206 described later to the manifold 209.

A boat rotator (also referred to as a "rotator") 254 configured to rotate the boat 217 is provided below the boat 217. By driving the boat rotator 254, it is possible to rotate the boat 217 in the process chamber 201 and the boat 217 in the loading chamber 141. A configuration of the boat rotator 254 will be described later.

Gas Supplier

A gas supply nozzle 280 through which a process gas is supplied into the process chamber 201 is connected to the manifold 209 so as to penetrate a side wall of the manifold 209. For example, the gas supply nozzle 280 is made of a material such as $SiO_2$ and SiC. The gas supply nozzle 280 may be embodied by an L-shaped nozzle including a horizontal portion and a vertical portion. The horizontal portion of the gas supply nozzle 280 is connected to the side wall of the manifold 209, and the vertical portion of the gas supply nozzle 280 is provided in a space between an inner wall of the reaction tube 205 and the wafers 200 in the process chamber 201 so as to extend from a lower portion of the reaction tube 205 toward an upper portion of the reaction tube 205 along the inner wall of the reaction tube 205 in a stacking direction of the wafers 200. A plurality of supply holes (not shown) through which a gas such as the process gas is supplied are provided at a side surface of the vertical portion of the gas supply nozzle 280 to face centers of the wafers 200 in the process chamber 201, respectively. An opening diameter of each supply hole may be appropriately adjusted so as to optimize a flow rate distribution and a flow velocity distribution of the gas in the process chamber 201. The opening diameter of each supply hole may be the same from a lower region to an upper region of the vertical portion of the gas supply nozzle 280, or may be gradually increased from the lower region to the upper region of the vertical portion of the gas supply nozzle 280.

A gas supply pipe 232 is connected to an upstream end of the gas supply nozzle 280. The gas supply pipe 232 is divided into four gas supply pipes at a location in an upstream portion of the gas supply pipe 232. Gas supply sources 191, 192, 193 and 194, mass flow controllers (MFCs) 181, 182, 183 and 184 serving as gas flow controllers and valves 171, 172, 173 and 174 serving as opening/closing valves are sequentially connected to the four gas supply pipes of the gas supply pipe 232 in order from upstream sides to downstream sides of the four gas supply pipes of the gas supply pipe 232, respectively. For example, a silicon (Si)-containing gas such as silane ($SiH_4$) gas, disilane ($Si_2H_6$) gas, and dichlorosilane ($SiH_2Cl_2$) gas is supplied from the gas supply source 191. For example, a germanium (Ge)-containing gas such as germane ($GeH_4$) gas is supplied from the gas supply source 192. For example, hydrogen ($H_2$) gas is supplied from the gas supply source 193. For example, nitrogen ($N_2$) gas serving as an inert gas is supplied from the gas supply source 194. By opening the valves 171 through 174, a mixed gas of the silicon-containing gas and the germanium-containing gas, which are serving as process gases, and the $H_2$ as a diluting gas are supplied into the process chamber 201. Further, by closing the valves 171, 172 and 173 and opening the valve 174, an inside of the gas supply nozzle 280 is purged by the $N_2$ gas serving as a purge gas. It is possible to adjust a flow rate of the purge gas by the MFC 184.

A controller 240 described later is electrically connected to the MFCs 181 through 184 and the valves 171 through 174. The controller 240 is configured to control opening degrees of each of the MFCs 181 through 184 such that a flow rate of the gas supplied into the process chamber 201 can be adjusted to a predetermined flow rate at a predetermined timing. A gas supplier (which is a gas supply system) is constituted mainly by the gas supply nozzle 280, the gas supply pipe 232, the valves 171 through 174, the MFCs 181 through 184, and the gas supply sources 191 through 194.

Heater

The heater 206 serving as a heating structure configured to heat an inside of the reaction tube 205 is provided outside the reaction tube 205. The heater 206 may surround a surface of a side wall of the reaction tube 205 to be aligned in a manner concentric with the reaction tube 205. The heater 206 is of a cylindrical shape. The heater 206 is vertically installed while being supported by a heater base (not shown) serving as a support plate. A temperature sensor (not shown) serving as a temperature detector configured to detect an inner temperature of the process chamber 201 is provided in the vicinity of the heater 206. The controller 240 described later is electrically connected to the heater 206 and the temperature sensor. The controller 240 is configured to control the power supplied to the heater 206 based on temperature information detected by the temperature sensor such that a predetermined temperature distribution of the inner temperature of the process chamber 201 can be obtained at a predetermined timing.

Exhauster

An exhaust pipe 231 through which an inner atmosphere of the process chamber 201 is exhausted is provided at the side wall of the manifold 209. A pressure sensor (not shown) serving as a pressure detector configured to detect an inner pressure of the process chamber 201, an APC (Automatic Pressure Controller) valve 242 serving as a pressure regulator and a vacuum pump 246 are sequentially provided at a downstream portion of the exhaust pipe 231 (that is, a portion of the exhaust pipe 231 opposite to a portion to which the manifold 209 is connected) in order from an upstream side of the exhaust pipe 231 to a downstream side of the exhaust pipe 231. The APC valve 242 is capable of adjusting the inner pressure of the process chamber 201 by adjusting an opening degree of the APC valve 242. The pressure sensor is not limited to the configuration provided at the exhaust pipe 231. The pressure sensor may be provided in the process chamber 201 instead of the exhaust pipe 231.

The controller 240 described later is electrically connected to the pressure sensor and the APC valve 242. The controller 240 is configured to control the opening degree of the APC valve 242 such that the inner pressure of the process chamber 201 can be adjusted to a predetermined pressure (vacuum degree) at a predetermined timing based on pressure information detected by the pressure sensor. An exhauster (which is an exhaust system) is constituted mainly by the exhaust pipe 231, the pressure sensor (not shown), the APC valve 242 and the vacuum pump 246.

Wafer Charging Structure

As shown in FIG. 1, the wafer charging structure 28 serving as a substrate charging structure is provided outside the loading chamber 141. The wafer charging structure 28 may include: a wafer charging device 28a serving as a substrate charging device configured to place the wafer 200 on tweezers 32 serving as a substrate holder and configured to move the wafer 200 placed on the tweezers 32 in the horizontal direction; and a wafer charging device elevator (not shown) serving as a substrate charging device elevator configured to elevate or lower the wafer charging device 28a. It is possible to transfer the wafer 200 from an outside of the loading chamber 141 to an inside of the loading chamber 141 through the opening 15 and to charge (or load) the wafer 200 into the slot in the boat 217 by the cooperative operations of the wafer charging device 28a and the wafer charging device elevator. Further, it is also possible to discharge (or unload) the wafer 200 from the slot in the boat 217 and to transfer the wafer 200 from the inside of the loading chamber 141 to the outside of the loading chamber 141 through the opening 15 by the cooperative operations of the wafer charging device 28a and the wafer charging device elevator. According to a wafer charging and discharging procedure described later, the wafer charging device elevator may be omitted. The wafer charging structure 28 according to the present embodiments is arranged above the outside of the loading chamber 141. However, in FIG. 1, for convenience of illustration, the wafer charging structure 28 is illustrated below the outside of the loading chamber 141.

Boat Elevator

As shown in FIG. 2, a boat elevator 115 serving as a transfer structure configured to elevate or lower the boat 217 is provided on an outer surface of a side wall of the sub-housing 13 constituting the loading chamber 141. The boat elevator 115 may include a lower plate 245, a guide shaft 264, a ball screw 244, an upper plate 247, an elevating motor 248, an elevating plate 252 and a bellows 265. The lower plate 245 is fixed in a horizontal orientation to the outer surface of the side wall of the sub-housing 13 constituting the loading chamber 141. The guide shaft 264 engaged with an elevating table 249 and the ball screw 244 screw-fixed with the elevating table 249 are provided at the lower plate 245 in a vertical orientation. The upper plate 247 is fixed in a horizontal orientation to upper ends of the guide shaft 264 and the ball screw 244. The ball screw 244 is configured to be rotated by the elevating motor 248 provided on the upper plate 247. The guide shaft 264 is configured such that the elevating table 249 can be elevated or lowered while suppressing a rotation of the elevating table 249 in the horizontal direction. By rotating the ball screw 244, it is possible to elevate or lower the elevating table 249.

An elevating shaft 250 which is hollow is fixed to the elevating table 249 in a vertical orientation. A connecting portion between the elevating table 249 and the elevating shaft 250 is airtightly configured. The elevating shaft 250 is configured to be elevated or lowered together with the elevating table 249. A lower end of the elevating shaft 250 penetrates the top plate 142 constituting the loading chamber 141. An inner diameter of a through-hole provided in the top plate 142 of the loading chamber 141 is greater than an outer diameter of the elevating shaft 250 such that the elevating shaft 250 and the top plate 142 do not come into contact with each other. The bellows 265 serving as a hollow elastic structure is provided between the loading chamber 141 and the elevating table 249 so as to cover a periphery of the elevating shaft 250. A connecting portion between the elevating table 249 and the bellows 265 and a connecting portion between the top plate 142 and the bellows 265 are airtightly configured such that the loading chamber 141 is airtightly maintained. An amount of expansion and contraction of the bellows 265 is sufficient to correspond to an amount of elevation of the elevating table 249. An inner diameter of the bellows 265 is configured to be sufficiently greater than the outer diameter of the elevating shaft 250 such that the elevating shaft 250 and the bellows 265 do not come into contact with each other.

The elevating plate 252 is fixed in a horizontal orientation at the lower end of the elevating shaft 250 protruding into the loading chamber 141. A connecting portion between the elevating shaft 250 and the elevating plate 252 is airtightly configured. A seal cap 219 is airtightly attached to an upper surface of the elevating plate 252 via a seal (not shown) such as an O-ring. The seal cap 219 is made of a metal such as stainless steel, and is of a disk shape. The seal cap 219 is configured to vertically support the boat 217 from thereunder, and to close the furnace opening 160 provided at a lower end of the process furnace 202 when the boat elevator 115 is elevated. By driving the elevating motor 248 to rotate the ball screw 244 and by elevating the elevating table 249, the elevating shaft 250, the elevating plate 252 and the seal cap 219, the boat 217 is loaded into the process chamber 201, and the furnace opening 160 serving as the opening of the process furnace 202 can be closed by the seal cap 219. By driving the elevating motor 248 to rotate the ball screw 244 and by lowering the elevating table 249, the elevating shaft 250, the elevating plate 252 and the seal cap 219, the boat 217 is unloaded out of the process chamber 201. The controller 240 described later is electrically connected to the elevating motor 248. The controller 240 is configured to control the boat elevator 115 to perform a predetermined operation at a predetermined timing.

A driver cover 253 is airtightly attached to a lower surface of the elevating plate 252 via a seal (not shown) such as an O-ring. A driver storage case 256 is constituted by the elevating plate 252 and the driver cover 253. An inner atmosphere of the driver storage case 256 is isolated from an inner atmosphere of the loading chamber 141. The boat rotator 254 is provided inside the driver storage case 256. A power supply cable 258 is connected to the boat rotator 254. The power supply cable 258 is guided in the elevating shaft 250 from an upper end of the elevating shaft 250 to the boat rotator 254, and is configured to supply the electric power to the boat rotator 254. An upper end of a rotating shaft 255 included in the boat rotator 254 penetrates the seal cap 219 and supports the boat 217 described above from thereunder. By operating the boat rotator 254, it is possible to rotate the wafer 200 supported by the boat 217 in the process chamber 201 and the wafer 200 supported by the boat 217 in the loading chamber 141. The controller 240 described later is electrically connected to the boat rotator 254. The controller 240 is configured to control the boat rotator 254 to perform a predetermined operation at a predetermined timing.

A cooling structure 257 is provided in the driver storage case 256 around the boat rotator 254. A cooling flow path 259 is provided at the cooling structure 257 and the seal cap 219. A cooling water pipe 260 through which a cooling water is supplied is connected to the cooling flow path 259. The cooling water pipe 260 is guided in the elevating shaft 250 from the upper end of the elevating shaft 250 to the cooling flow path 259, and is configured such that the cooling water is supplied to the cooling flow path 259.

Controller

Figure 3:
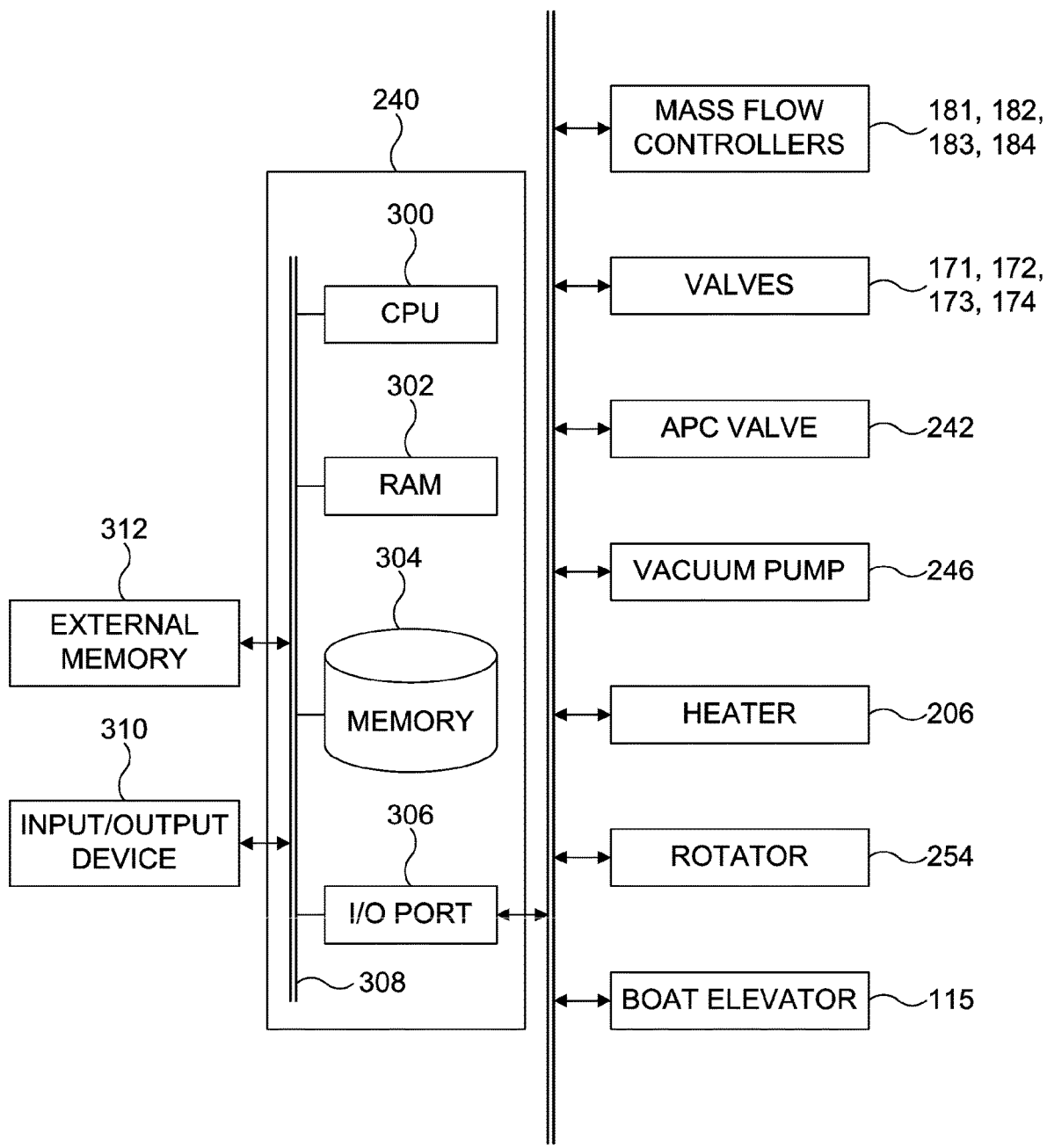
FIG. 3 is a block diagram schematically illustrating a configuration of a controller and related components of the substrate processing apparatus described herein.

As shown in FIG. 3, the controller 240 serving as a control structure is constituted by a computer including a CPU (Central Processing Unit) 300, a RAM (Random Access Memory) 302, a memory 304 and an I/O port 306. The RAM 302, the memory 304 and the I/O port 306 may exchange data with the CPU 300 through an internal bus 308. For example, an input/output device 310 such as a touch panel is connected to the controller 240.

The memory 304 is configured by components such as a flash memory and a hard disk drive (HDD). For example, a control program configured to control the operation of the substrate processing apparatus 10 or a process recipe containing information on the sequences and conditions of a substrate processing described later is readably stored in the memory 304. The process recipe is obtained by combining steps of the substrate processing described later such that the controller 240 can execute the steps to acquire a predetermine result, and functions as a program. Hereafter, the process recipe and the control program may be collectively or individually referred to as a "program". In addition, the process recipe may also be simply referred to as a "recipe". In the present specification, the term "program" may refer to the recipe alone, may refer to the control program alone, or may refer to both of the recipe and the control program. The RAM 302 functions as a memory area (work area) where a program or data read by the CPU 300 is temporarily stored.

The I/O port 306 is connected to the above-described components such as the MFCs 181 through 184, the valves 171 through 174, the APC valve 242, the vacuum pump 246, the heater 206, the rotator 254 and the boat elevator 115.

The CPU 300 is configured to read the control program from the memory 304 and execute the read control program. In addition, the CPU 300 is configured to read the recipe from the memory 304 in accordance with an operation command inputted from the input/output device 310. According to the contents of the read recipe, the CPU 300 may be configured to control various operations such as flow rate adjusting operations for various gases by the MFCs 181 through 184, opening/closing operations of the valves 171 through 174, an opening/closing operation of the APC valve 242, a pressure adjusting operation by the APC valve 242 based on the pressure sensor (not shown), a start and stop of the vacuum pump 246, a temperature adjusting operation of the heater 206 based on the temperature sensor (not shown), an operation of adjusting the rotation and the rotation speed of the boat 217 by the rotator 254 and an elevating and lowering operation of the boat 217 by the boat elevator 115.

The controller 240 may be embodied by installing the above-described program stored in an external memory 312 into a computer. For example, the external memory 312 may include a magnetic disk such as a hard disk drive (HDD), an optical disk such as a CD, a magneto-optical disk such as an MO and a semiconductor memory such as a USB memory. The memory 304 or the external memory 312 may be embodied by a non-transitory computer readable recording medium. Hereinafter, the memory 304 and the external memory 312 are collectively or individually referred to as a recording medium. In the present specification, the term "recording medium" may refer to the memory 304 alone, may refer to the external memory 312 alone, or may refer to both of the memory 304 and the external memory 312. Instead of the external memory 312, a communication means such as the Internet and a dedicated line may be used for providing the program to the computer.

2. Operation Example of Substrate Processing Apparatus

The substrate processing apparatus 10 of the present embodiments repeatedly performs a series of processes (hereinafter, also referred to as a "batch process") including a discharging and charging process of the wafers 200, a loading and unloading process of the boat 217 and a film-forming process. Since the film-forming process is performed in which the wafers 200 are heated as described later, not only the wafers 200 but also various components in the process chamber 201, that is, components such as the boat 217 and the reaction tube 205, are also heated when the film-forming process is performed. Hereinafter, a series of operation flows of completing the film-forming process in a predetermined batch process ($n^{th}$ time), unloading the wafers 200 and the boat 217 (which are heated) out of the process chamber 201 (which is heated) and performing a subsequent batch process ($(n+1)^{th}$ time) will be described in detail with reference to FIG. 4.

Boat Moving Step

When a film-forming step (step 10, hereinafter, the term "step" may be abbreviated as "S") of an nth time is completed, a boat moving step (S20) is performed. In the boat moving step (S20), instead of moving the entirety of the boat 217 out of the process chamber 201 to the loading chamber 141, the boat 217 is partially moved toward the loading chamber 141. Specifically, for example, the boat elevator 115 is operated such that the boat 217 holding the processed wafers 200 is moved by one slot from the process chamber 201 to the loading chamber 141 (see FIG. 5B). When the movement distance of the boat 217 reaches one slot, the movement of the boat 217 is stopped.

In order to safely discharge and charge the wafer 200 described later, it is preferable to stop the rotation of the boat 217 at least after stopping the movement of the boat 217.

Wafer Discharging/Charging Step

When the boat moving step (S20) is completed, a wafer discharging/charging step (S30) is performed. In the wafer discharging/charging step (S30), the gate 15a is lowered to open the opening 15. The wafer charging structure 28 is operated to discharge the processed wafer 200 among the wafers 200 from the slot of the boat 217 moved out of the reaction tube 205. The processed wafer 200 is transferred out of the inside of the loading chamber 141 to the outside of the loading chamber 141 through the opening 15, and then is accommodated in the pod 16 set in the pod opener 24. In addition, the wafer charging structure 28 is operated, an unprocessed wafer 200 among a plurality of unprocessed wafers is taken out of the pod 16 in which the unprocessed wafer 200 has been accommodated. Hereinafter, the plurality of unprocessed wafers including the unprocessed wafer 200 may also be simply referred to as unprocessed wafers 200. The unprocessed wafer 200 is transferred to the inside of the loading chamber 141 from the outside of the loading chamber 141 through the opening 15, and then is charged into the slot emptied by discharging the processed wafer 200. Since movement of the boat 217 is stopped, it is possible to safely and reliably discharge the processed wafer 200 and to safely and reliably charge the unprocessed wafer 200.

Repeatedly Performing Moving of Boat and Discharging/Charging of Wafer

Figure 5A:
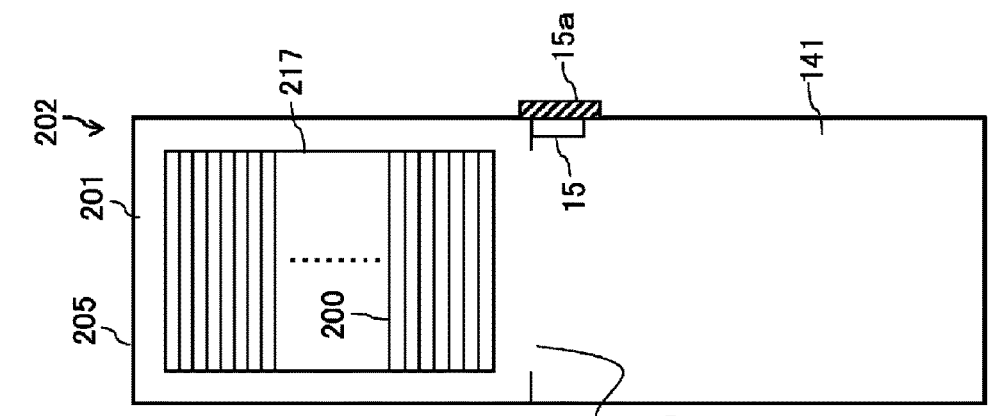
FIGS. 5A through 5D are diagrams schematically illustrating a charging and discharging of a wafer and a loading and unloading of a boat according to the embodiments described herein.
Figure 5B:
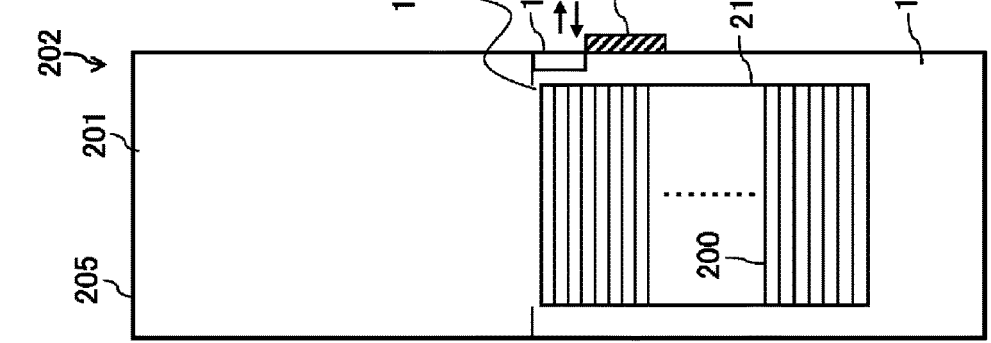
Figure 5C:
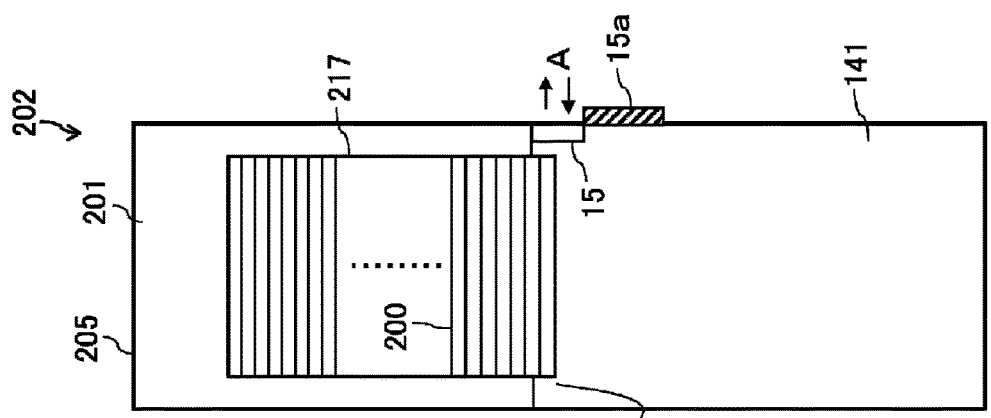

A set including a boat moving step (S20) of moving the boat 217 such that one or more of the slots are located outside the reaction tube 205 and a wafer discharging/charging step (S30) of discharging one or more of the processed wafers 200 out of the one or more of the slots and charging one or more of the unprocessed wafers 200 into the one or more of the slots is repeatedly performed until discharging of target wafers to be discharged and charging of target wafers to be charged are completed (see FIGS. 5B and 5C). Hereinafter, in the present specification, a step of repeatedly performing the set including the boat moving step (S20) and the wafer discharging/charging step (S30) may be simply referred to as a "repeating step". In the present specification, "discharging of the target wafers to be discharged and charging of the target wafers to be charged are completed" may refer to, for example, a sequence where the unprocessed wafers 200 are charged into the plurality of slots emptied by discharging the processed wafers 200 completely from a lowermost slot to an uppermost slot.

As described above, not only the wafers 200 but also the components such as the boat 217 and the reaction tube 205 are heated by performing the film-forming process. According to the present embodiments, by performing the repeating step (S20 and S30) once, for example, the boat 217 is moved by one slot without unloading the entirety of the boat 217 into the loading chamber 141. Therefore, since a heated part of the boat 217 may remain inserted in the reaction tube 205, it is possible to suppress a temperature drop of the boat 217.

In addition, since the part of the boat 217 may remain inserted in the reaction tube 205, the furnace opening 160 is closed by the boat 217. Therefore, it is possible to suppress a temperature drop due to the radiation in the reaction tube 205 through the furnace opening 160.

Thereby, it is possible to increase the productivity of the substrate processing, and it is also possible to easily maintain an inner temperature of the reaction tube 205 at a constant level even when the power supplied to the heater 206 is reduced.

The top plate 210 at an upper end of the boat 217 is configured such that a shape of the top plate 210 corresponds to the furnace opening 160 provided at the lower end of the reaction tube 205. Thereby, the furnace opening 160 is prevented from opened in its entirety by the top plate 210 (see FIG. 5C). With such a configuration, even when the boat 217 is moved (lowered) by the maximum distance in the boat moving step (S20), the top plate 210 at the upper end of the boat 217 closes the furnace opening 160 such that it is possible to suppress a temperature drop in the process chamber 201.

Boat Loading Step

Figure 5D:
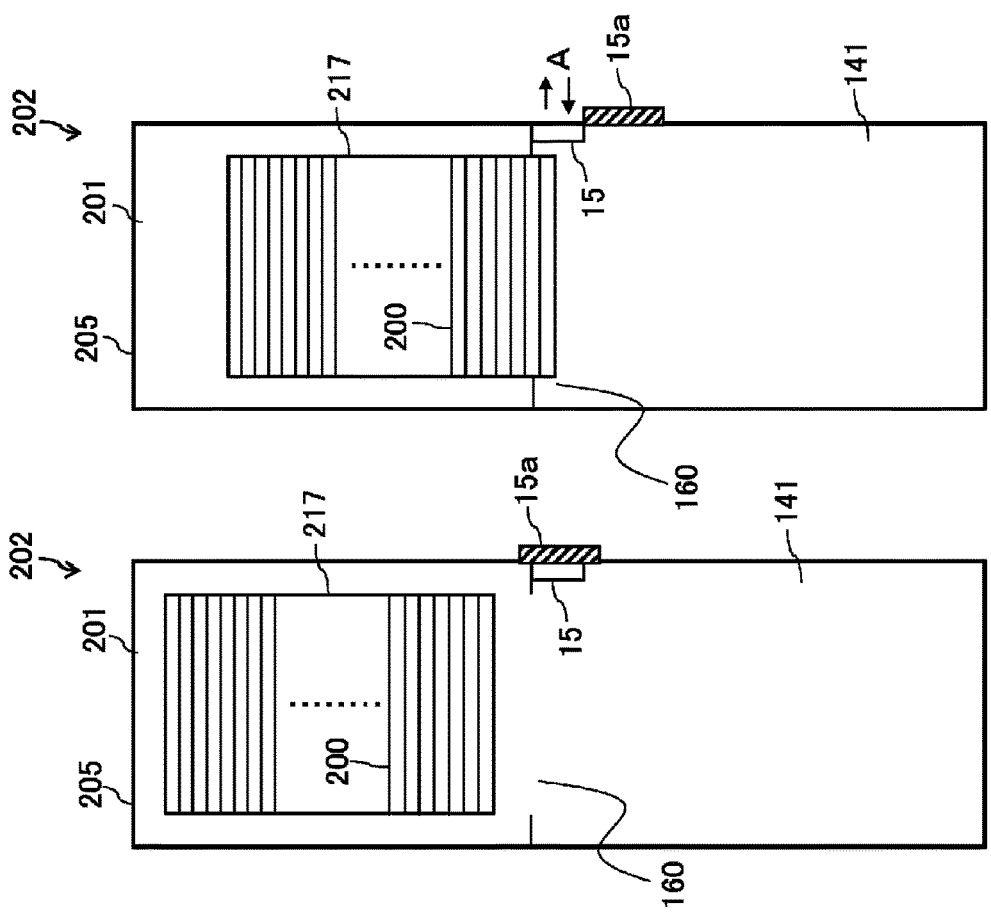

After the discharging of the target wafers to be discharged and the charging of the target wafers to be charged are completed, a boat loading step (S40) is performed. In the boat loading step (S40), the boat 217 is continuously elevated without stopping in the middle so as to accommodate the wafers 200 charged in the plurality of slots into the reaction tube 205 (that is, the process chamber 201). The gate 15a is elevated to close the opening 15 (see FIG. 5D).

In the boat loading step (S40), the boat 217 is rotated while being elevated. The wafers 200 loaded into the process chamber 201 from the loading chamber 141 may be heated by the residual heat in the process chamber 201. However, according to the present embodiments, it is possible to heat the wafers 200 transferred (loaded) into the process chamber 201 uniformly in a circumferential direction.

It is preferable to perform the boat moving step (S20), the wafer discharging/charging step (S30) and the boat loading step (S40) while the inside of the process chamber 201 and the inside of the loading chamber 141 are in a vacuum state (decompressed state) after taking measures to prevent particles from entering from the outside. By doing so, it is possible to further suppress a temperature drop such as the temperature drop of the boat 217 and the temperature drop in the process chamber 201.

Film-Forming Process

When the boat loading step (S40) is completed, the film-forming step (S10) of an $(n+1)^{th}$ time is performed. In the present step, the inside of the process chamber 201 is adjusted to a predetermined pressure and a predetermined temperature to heat the boat 217 inserted in the reaction tube 205. A mixed gas of the process gas and the diluting gas may be supplied into the process chamber 201 to deposit a predetermined film on surfaces of the wafers 200 (see FIG. 5A).

Thereafter, the batch process (that is, the series of the processes) including the boat moving step (S20), the wafer discharging/charging step (S30), the boat loading step (S40) and the film-forming step (S10) is repeatedly performed.

3. Effect According to Present Embodiments

The effects according to the present embodiments will be described in comparison with those of a comparative example.

According to a comparative example, a wafer discharging/charging step is performed in a state in which the entirety of the boat 217 is completely unloaded out of the process chamber 201 into the loading chamber 141. Therefore, when the wafer discharging/charging step of the comparative example is completed, the inner temperature of the process chamber 201 or an inner temperature of the boat 217 may be significantly lowered. As a result, it takes time to restore inner temperatures of the process chamber 201 and the boat 217 such that a subsequent batch process can be performed in the process chamber 201 and the boat 217 at an optimum process temperature, resulting in a decrease in the productivity of the substrate processing.

(a) On the other hand, according to the substrate processing apparatus 10 of the present embodiments, the set including the step of moving the boat 217 such that one or more of the slots included in the boat 217 in a multistage manner are located outside the reaction tube 205 and the step of discharging one or more of the processed wafers 200 out of the one or more of the slots and charging one or more of the unprocessed wafers 200 to the one or more of the slots is repeatedly performed. When discharging of the target wafers to be discharged and charging of the target wafers to be charged are completed, the boat 217 is continuously elevated without stopping in the middle so as to accommodate the wafers 200 charged in the plurality of slots into the reaction tube 205.

As described above, by performing the repeating step (S20 and S30) once, for example, the boat 217 is moved by one slot without unloading the entirety of the boat 217 into the loading chamber 141. Therefore, since a heated part of the boat 217 may remain inserted in the reaction tube 205, it is possible to suppress the temperature drop of the boat 217.

In addition, since the part of the boat 217 may remain inserted in the reaction tube 205, the furnace opening 160 is closed by the boat 217. Therefore, it is possible to suppress the temperature drop due to the radiation in the reaction tube 205 through the furnace opening 160.

Thereby, it is possible to increase the productivity of the substrate processing, and it is also possible to easily maintain the inner temperature of the reaction tube 205 at a constant level even when the power supplied to the heater 206 is reduced.

(b) The boat 217 is continuously elevated without stopping in the middle in the boat loading step (S40), whereas the boat 217 is lowered, for example, by one slot in the repeating step (S20 and S30). Therefore, the boat 217 is stopped whenever lowered by one slot in the repeating step (S20 and S30). As such, a movement velocity of the boat 217 in the boat loading step (S40) is higher in average than the movement velocity of the boat 217 in the repeating step (S20 and S30). As a result, it is possible to discharge and charge the processed wafers 200 safely and reliably; and to suppress the temperature drop of the boat 217 and the temperature drop in the process chamber 201. As a result, it is possible to increase the productivity of the substrate processing.

(c) According to the substrate processing apparatus 10 of the present embodiments, the boat 217 is lowered, for example, by one slot in the boat moving step (S20). In addition, the opening 15 is provided above the side wall of the loading chamber 141, and the wafer charging structure 28 is arranged above the outside of the loading chamber 141. Since the processed wafers 200 are discharged and the unprocessed wafers 200 are charged at a high position in the loading chamber 141 (see a position "A" shown in FIGS. 5B and 5C), it is possible to omit a wafer charging device elevator configured to elevate or lower the wafer charging structure 28. As a result, it is possible to further suppress the temperature drop of the boat 217, and it is also possible to simplify the configuration of the substrate processing apparatus 10.

(d) The present embodiments may be particularly and preferably applied when the number of the wafers 200 to be discharged or charged is large. For example, assuming that it takes 5 seconds for each wafer to be discharged and charged, according to a comparative example, the boat 217 is located out of the reaction tube 205 for 1,000 seconds (about 17 minutes) until discharging of the wafers 200 to be discharged and charging of the wafers 200 to be charged are completed. Thus, the temperature drop of the boat 217 while the boat 217 is outside the reaction tube 205 may be remarkable.

4. Modified Examples

While the technique of the present disclosure is described in detail by way of the embodiments described above, the above-described technique is not limited thereto. The above-described technique may be modified in various ways without departing from the scope thereof.

The above-described embodiments are described by way of an example in which the boat 217 charged with the wafers 200 is loaded into the process chamber 201 from the loading chamber 141 and then the mixed gas is supplied into the process chamber 201 in the film-forming step S10. However, the above-described technique is not limited thereto. For example, the above-described technique may also be applied when the supply of the mixed gas to the process chamber 201 may be started while the boat 217 is being loaded into the process chamber 201. By doing so, it is possible to complete the film-forming process more quickly.

The above-described embodiments are described by way of an example in which the boat 217 is elevated or lowered vertically in the vertical type heat treatment apparatus. However, the above-described technique is not limited thereto. For example, the above-described technique may also be applied when the boat 217 is moved horizontally in a horizontal type heat treatment apparatus as long as the boat 217 can be moved out of the reaction tube 205 by one slot at a time. In such a case, it is possible to obtain substantially the same effects according to the embodiment described above.

The above-described embodiments are described by way of an example in which the boat 217 is moved by one slot in the boat moving step (S20). However, the above-described technique is not limited thereto. For example, the above-described technique may also be applied when the boat 217 is moved by two slots or three slots. In such a case, it is possible to obtain substantially the same effects according to the embodiment described above. However, it is preferable to move the boat 217 by one slot because the effect of suppressing the temperature drop can be obtained to the maximum.

The above-described embodiments are described by way of an example in which the boat 217 is rotated while being elevated in the boat loading step (S40). However, the above-described technique is not limited thereto. For example, the above-described technique may also be applied when the boat 217 is not rotated. However, it is preferable to rotate the boat 217 since the wafers 200 can be uniformly heated.

The above-described embodiments are described by way of an example in which the wafers 200 are accommodated in the entirety of the plurality of slots from the lowermost slot to the uppermost slot. However, the above-described technique is not limited thereto. For example, the above-described technique may also be applied when the wafers 200 are accommodated from the lowermost slot to a middle slot among the plurality of slots. In such a case, the repeating step (S20 and S30) is performed until the processed wafers 200 to be discharged are completely discharged from the lowermost slot to the middle slot and the unprocessed wafers 200 to be charged are completely charged from the lowermost slot to the middle slot emptied by discharging the processed wafers 200.

The above-described embodiments are described by way of an example in which the film-forming process is performed as a heating process included in the substrate processing. However, the above-described technique is not limited thereto. For example, the above-described technique may also be applied when other processes such as an annealing process, an etching process and a diffusion process are performed as long as the other processes are performed as the heating process included in the substrate processing. In such a case, it is possible to obtain substantially the same effects according to the embodiment described above.

As described above, according to some embodiments in the present disclosure, it is possible to improve a productivity of the substrate processing described above.

What is claimed is:

1. A method of manufacturing a semiconductor device, comprising:
   (a) heating a substrate retainer in a reaction chamber, wherein the substrate retainer is provided with a plurality of slots capable of accommodating a plurality of substrates in a multistage manner;
   (b) repeatedly performing a set comprising:
      (b-1) moving the substrate retainer so as to locate one or more of the slots outside the reaction chamber; and
      (b-2) charging one or more of the substrates into the one or more of the slots; and
   (c) moving the substrate retainer such that the plurality of substrates charged in the plurality of slots are accommodated in the reaction chamber.

2. The method of claim 1, wherein a movement distance by which the substrate retainer is moved during each set in (b) is set to be equivalent to one slot.

3. The method of claim 2, wherein, in (b-2), the one or more of the substrates charged in the one or more of the slots are replaced with other substrates.

4. The method of claim 2, wherein a furnace opening of the reaction chamber is prevented from being opened in entirety in (b) by a top plate whose shape corresponds to the furnace opening and provided at an upper end of the substrate retainer.

5. The method of claim 2, wherein an inner temperature of the reaction chamber is maintained at a predetermined substrate processing temperature in (a), (b) and (c).

6. The method of claim 1, wherein, in (b-2), the one or more of the substrates charged in the one or more of the slots are replaced with other substrates.

7. The method of claim 6, wherein a furnace opening of the reaction chamber is prevented from being opened in entirety in (b) by a top plate whose shape corresponds to the furnace opening and provided at an upper end of the substrate retainer.

8. The method of claim 6, wherein an inner temperature of the reaction chamber is maintained at a predetermined substrate processing temperature in (a), (b) and (c).

9. The method of claim 1, wherein a movement of the substrate retainer is stopped in (b-2).

10. The method of claim 9, wherein a furnace opening of the reaction chamber is prevented from being opened in entirety in (b) by a top plate whose shape corresponds to the furnace opening and provided at an upper end of the substrate retainer.

11. The method of claim 9, wherein an inner temperature of the reaction chamber is maintained at a predetermined substrate processing temperature in (a), (b) and (c).

12. The method of claim 1, wherein a furnace opening of the reaction chamber is prevented from being opened in entirety in (b) by a top plate whose shape corresponds to the furnace opening and provided at an upper end of the substrate retainer.

13. The method of claim 12, wherein the furnace opening of the reaction chamber is prevented from being opened in entirety in (b) by the top plate whose shape corresponds to the furnace opening even when the substrate retainer is moved by a maximum distance.

14. The method of claim 1, wherein the substrate retainer is rotated while being moved in (c).

15. The method of claim 1, wherein an inner temperature of the reaction chamber is maintained at a predetermined substrate processing temperature in (a), (b) and (c).

16. The method of claim 1, wherein an inside and an outside of the reaction chamber are maintained in a decompressed state in (a), (b) and (c).

17. The method of claim 1, wherein a movement velocity of the substrate retainer in (c) is higher than the movement velocity of the substrate retainer in (b).

18. A substrate processing apparatus, comprising:
a substrate retainer provided with a plurality of slots capable of accommodating a plurality of substrates in a multistage manner;
a reaction chamber in which the substrate retainer is accommodated;
a heater configured to heat an inside of the reaction chamber;
a transfer structure configured to transfer the substrate retainer into the reaction chamber or out of the reaction chamber;
a substrate charging structure configured to charge the plurality of substrates into the plurality of slots; and
a controller connected to the heater, the transfer structure and the substrate charging structure and configured to be capable controlling the heater, the transfer structure and the substrate charging structure to perform:
  (a) heating the substrate retainer in the reaction chamber;
  (b) repeatedly performing a set comprising:
    (b-1) moving the substrate retainer so as to locate one or more of the slots outside the reaction chamber; and
    (b-2) charging one or more of the substrates into the one or more of the slots; and
  (c) moving the substrate retainer such that the plurality of substrates charged in the plurality of slots are accommodated in the reaction chamber.

19. A non-transitory computer-readable recording medium storing a program that causes, by a computer, a substrate processing apparatus to perform:
  (a) heating a substrate retainer in a reaction chamber, wherein the substrate retainer is provided with a plurality of slots capable of accommodating a plurality of substrates in a multistage manner;
  (b) repeatedly performing a set comprising:
    (b-1) moving the substrate retainer so as to locate one or more of the slots outside the reaction chamber; and
    (b-2) charging one or more of the substrates into the one or more of the slots; and
  (c) moving the substrate retainer such that the plurality of substrates charged in the plurality of slots are accommodated in the reaction chamber.

* * * * *